SEMI-CONDUCTOR SIGNAL CONVEYING CIRCUITS

Filed Sept. 30, 1953

INVENTOR.
Loy E. Barton
BY H. L. Newton
ATTORNEY 2,924,778
Patented Feb. 9, 1960

2,924,778

SEMI-CONDUCTOR SIGNAL CONVEYING CIRCUITS

Loy E. Barton, Princeton, N.J., assignor to Radio Corporation of America, a corporation of Delaware Application September 30, 1953, Serial No. 383,283
4 Claims. (Cl. 330—15)

Figure 1:
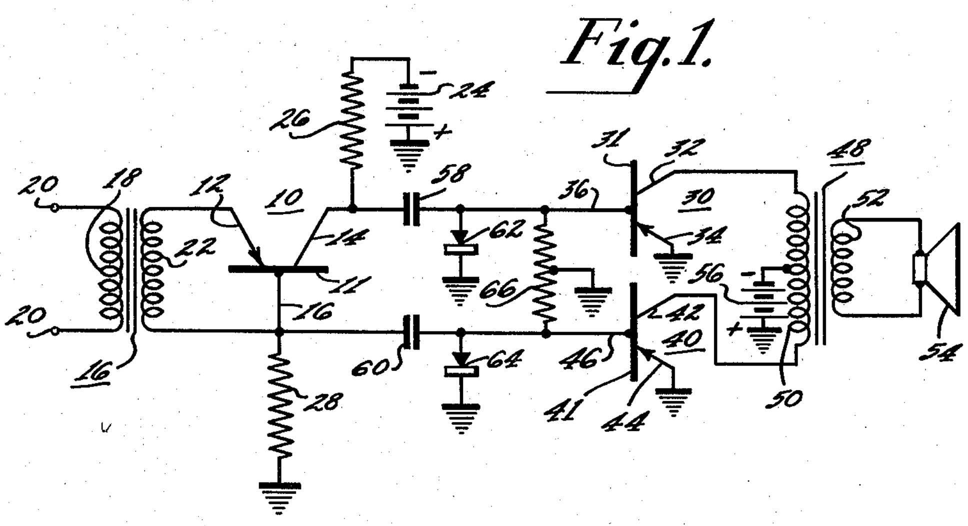

This invention relates in general to signal conveying circuits and the like utilizing semi-conductor devices as the control and amplifying elements, and in particular to balanced or push-pull amplifier circuits utilizing semi-conductor devices.

For many electronic circuit applications, relatively large power output with low signal distortion is desired. Thus, for example, electron discharge and semi-conductor devices alike, have been used heretofore as the amplifying elements in signal amplifying circuits of the push-pull or balanced type to achieve these results. In the conventional class B push-pull power amplifier circuit, one amplifying element may predominantly amplify either the positive or negative portion of the signal and does not pass the other portion of the signal as well. The signal is also inverted in phase by a suitable driving source and applied to a second amplifying element, such as an electron discharge tube or semi-conductor device. The amplified inverted wave is then re-inverted and combined with the other amplified wave to produce, in amplified form, the original signal. Among the known types of push-pull amplifier circuits, the class B push-pull power amplifier generally has the highest efficiency for the amplification of signal intelligence, and is, therefore, preferred for many circuit applications.

To provide the amplifying elements of an electron discharge tube or semi-conductor push-pull amplifier circuit with voltages which are equal in instantaneous amplitude and opposite in instantaneous polarity, a balanced driving source is generally utilized. To provide such a balanced driving source for class B push-pull amplifier operation, a push-pull input transformer having a single primary winding and a center-tapped secondary winding is generally necessary. A push-pull input transformer of this type may at best give rise to distortion due to phase shift, saturation at low frequencies, or resonance effects at high frequencies. In addition to these disadvantages, the input transformer adds appreciably to the cost of the circuit and where size is a factor, increases the bulk of the circuit. In other push-pull circuits such as those disclosed in U.S. Patent 2,338,410 to V. M. Cousins, dated January 4, 1944, the use of a single-ended unbalanced driving or exciting source may be utilized, although in these circuits the single-ended source must be ungrounded.

The present invention overcomes these and other disadvantages of conventional push-pull amplifier circuits by providing means wherein a double-ended balanced driving or exciting source for a class B semi-conductor push-pull amplifier circuit may be resistance coupled to the push-pull output stage.

It is, accordingly, an object of the present invention to provide a push-pull amplifier circuit utilizing semi-conductor devices in which the need for a conventional push-pull input transformer is obviated.

A further object of this invention is to provide a semi-conductor amplifier circuit of the class B type which enables push-pull operation without transformer coupling.

Still another object of the present invention is to provide a push-pull or balanced power amplifier circuit of the class B type utilizing semi-conductor devices as the amplifying elements whereby a double-ended balanced driving source may be resistance coupled thereto.

These and further objects and advantages of the present invention are achieved in a push-pull amplifier circuit of the type utilizing semi-conductor devices or transistors by connecting a unilateral device such as a germanium diode in circuit with the input electrodes of each of the push-pull output transistors. In this manner, each of the output transistors is alternately non-conductive for slightly more than a half-cycle of signal voltage and the balanced phase inverting driver or exciting source may be resistance coupled to the transistor push-pull output stage without the need of transformer coupling. In another aspect of the present invention, transistors are connected in circuit with the input electrodes of each of the push-pull output transistors to permit resistance coupling with the exciting or driver source.

Figure 2:
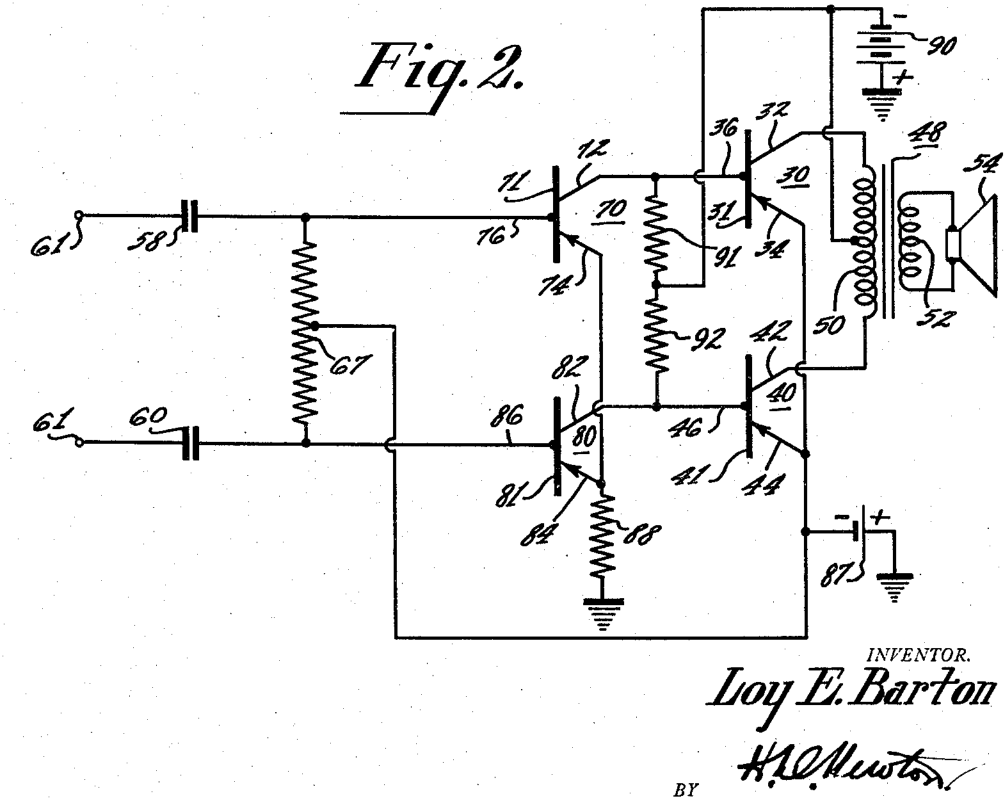

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a push-pull class B power amplifier circuit utilizing transistors in accordance with the invention; and Figure 2 is a schematic circuit diagram of a push-pull class B power amplifier circuit illustrating a further embodiment of the invention.

Referring now to the drawing wherein like elements are designated by like reference numerals in both figures, and referring particularly to Figure 1, a P–N–P junction transistor 10 includes a semi-conductive body 11 and three contacting electrodes which are an emitter electrode 12, a collector electrode 14 and a base electrode 16. The input circuit for transistor 10 includes an input transformer 16 comprising a primary winding 18 provided with a pair of input terminals 20 and a secondary winding 22 which is connected respectively to the emitter 12 and the base 16 of transistor 10.

Proper biasing voltages for transistor 10 may be obtained for any convenient direct current voltage source, such as, for example, a battery 24, which is connected between a point of fixed reference potential or ground for the system and one end of a load resistor 26, the other end of which is connected to the collector 14. A load resistor 28 is connected from the base 16 to ground. It is noted that the polarity of the battery has been chosen for proper biasing of a P–N–P junction transistor, although it should be understood that N–P–N transistors could be used equally well if the polarity of the biasing source is reversed. As shown, the transistor 10 may serve as the balanced phase inverting driver or exciting source for a pair of push-pull output transistors 30 and 40. It should also be noted that the transistor 10 may be the second detector of a receiver by so choosing the biasing voltages that they will operate over a non-linear portion of its characteristic curve.

Each of the push-pull output transistors 30 and 40 is of the P–N–P junction type and is connected for grounded emitter, base input operation. The output circuit for the transistors 30 and 40 includes an output transformer 48 which is provided with a primary winding 50 which is connected respectively with the collectors 32 and 42 of output transistors 30 and 40, respectively. A secondary winding 52 of the output transformer 48 may be connected to any suitable sound reproducing device or other utilization means, which has been illustrated as being a loudspeaker 54.

Biasing voltages for the desired push-pull amplifying action may be obtained from any suitable source of direct current voltage such as illustrated by a battery 56, which is connected between ground and a center tap on the primary winding 50 of output transformer 48. Bias for the base electrodes 36 and 46 is provided by a voltage divider resistor 66 which is grounded at a predetermined point as shown and which is connected between the base electrodes. If needed, the tap to ground may be alternatively connected to the negative terminal of a battery. In either case, the transistors 30 and 40 should be biased such that substantially no collector current flows for static operating conditions. It is noted that, as illustrated, the polarity of battery 56 is chosen to provide proper bias for P–N–P junction transistors. It should be understood, however, that here again transistors of the N–P–N type may be utilized by reversing the polarity of the biasing battery.

In accordance with the present invention, the collector 14 and the base 16 of the driver transistor 10 are coupled to the bases 36 and 46 of the push-pull output transistors 36 and 46, respectively, without the need for a coupling transformer. To this end, collector 14 of the driver transistor 10 is coupled through coupling capacitor 58 to the base 36 of push-pull transistor 30, while the base 16 of the driver transistor 10 is connected to the base 46 of the other push-pull output transistor 40 through a coupling capacitor 60. To permit this coupling, without the need for a transformer, a diode 62, which may be of the germanium type, is connected in series between the base 36 of the push-pull transistor 30 and ground, and a similar diode 64 is connected in series between the base 46 of push-pull transistor 40 and ground. The diodes 62 and 64, as will be seen hereinafter, essentially clamp the base electrodes 36 and 46, respectively, to zero or ground potential during alternate half cycles of the applied signals, thus permitting efficient and reliable class B amplification action.

In operation, the incoming signal, which may, for example, be a modulated intermediate frequency signal, is coupled through the input transformer 16 and applied between the emitter 12 and the base 16 of the driver transistor 10. As was explained hereinbefore, transistor 10, in addition to being the phase-inverting driving source, may also serve as a second detector for the receiver to separate the modulation component from the signal. The push-pull output signal, such as, for example, an audio frequency signal derived from the transistor 10 is coupled through coupling capacitors 58 and 60 to the base electrodes 36 and 46, respectively, of push-pull output transistors 30 and 40.

If it is assumed that a negative half cycle of signal is applied to the base 36 of output transistor 30 through the coupling capacitor 58, a half cycle amplified version of this signal will appear in the collector 32 of transistor 30 and will flow through one half of the primary winding 50 of output transformer 48. During the negative half cycle of signal the diode 62 presents a high impedance and will not affect the operation of transistor 30. At the same time, the positive half cycle portion of the signal is coupled through the coupling capacitor 60 to the base 46 of the other push-pull output transistor 40. Since the negative electrode of diode 64 is connected to ground, it will be conductive in the same direction as the signal, and the base 46 of transistor 40 will remain or be clamped at substantially ground potential. The diode 64 will also dissipate any charge that has accumulated on capacitor 60. Because the diode is conducting current for this portion of the cycle, it will, in effect, short circuit the load resistor 28 in the base circuit of the driver transistor 10 for alternating currents and most of the output signal from the driver transistor will be derived across the load resistor 26 in its collector circuit.

During the next half cycle of the signal, the positive portion of the signal will be coupled through the capacitor 58 to the base 36 of output transistor 30. Since, however, the diode 62 conducts in this direction, the base 36 of transistor 30 will be clamped to ground potential and the load resistor 26 will be short circuited by diode 62. At the same time, the negative portion of the signal will be applied to the base 46 of output transistor 40 through coupling capacitor 60. An amplified version of this signal will appear at the collector 42 of transistor 40 and will flow through the other half of the primary winding 50 of output transformer 48. The signals through each half of the primary winding are combined to provide an amplified version of the original signals. The output signal is then coupled through the secondary winding 52 of output transformer 48 to the loudspeaker 54.

As described above, efficient class B push-pull operation is achieved without the provision of transformer coupling from the driver source to the push-pull output stage. By clamping the base electrodes of the output transformers to ground for alternate half cycles of the signal, proper conductivity for class B operation is achieved with simple resistance coupling.

In Figure 2, reference to which is now made, a high gain circuit providing class B push-pull operation without the provision of transformer coupling includes a pair of input transistors 70 and 80 and a push-pull output stage which is identical with the one illustrated in Figure 1. The input circuit for transistors 70 and 80 includes a pair of input terminals 61, to which input signals from a balanced phase inverting driver source of any suitable type may be applied. The input terminals 61 are coupled through coupling capacitors 58 and 60 to the base electrodes 76 and 86 of the input transistors 70 and 80, respectively. The transistors 70 and 80 include, in addition, semi-conductive bodies 71 and 81, emitter electrodes 74 and 84, and collector electrodes 72 and 82, respectively.

Base bias for each of the input transistors 70 and 80 is obtained from a battery 87, the positive terminal of which is grounded as shown and the negative terminal of which is connected to a tap on a voltage dividing resistor 67. The resistor 67 is connected in parallel with coupling capacitors 58 and 60 and between the base or input electrodes 76 and 86 of respective transistors 70 and 80. The emitter electrodes 74 and 84 of transistors 70 and 80, respectively, are connected together and through a common resistor 88 to ground. By using a single, rather than separate resistors for each transistor, by-passing of the common resistor 88 has been found unnecessary.

The output or collector electrodes 72 and 82 of transistors 70 and 80, respectively, are coupled directly to the input or base electrodes 36 and 46 of the push-pull output transistors 30 and 40, respectively. Bias voltages for the collectors 72 and 82 of input transistors 70 and 80, respectively, and for the bases 36 and 46 of the respective push-pull transistors 30 and 40 are obtained from a battery 90, the positive terminal of which is grounded and the negative terminal of which is connected to the junction of a pair of voltage dividing resistors 91 and 92. The resistors 91 and 92 are connected together in series relationship and in parallel with the conductive output paths which connect the collectors 72 and 82 to the bases 36 and 46 of the push-pull output transistors 30 and 40, respectively. As illustrated, each of the transistors 30, 40, 70 and 80 is of the P–N–P type and the biasing is proper for that type transistor. Accordingly, each of the collector electrodes is biased to be in a relatively non-conducting or reverse direction with respect to their respective base electrodes while each of the emitter electrodes is biased in a relatively conducting or forward direction with respect to their respective base electrodes. It should be understood that N–P–N junction transistors could be used by reversing the polarity of the direct current biasing voltage source.

The output circuit for the push-pull output transistors is identical with the one illustrated in Figure 1. Thus, the primary winding 50 of output transformer 48 is connected respectively with the collectors 32 and 42 of output transistors 30 and 40, respectively. The secondary winding 52 of the output transformer 48 is connected to a suitable sound reproducing means, such as, for example, a loudspeaker 54.

In the embodiment of the invention illustrated in Figure 2, the input transistors 70 and 80 are used to obtain the effect of the diodes 62 and 64 of Figure 1, and at the same time will add additional gain to the amplifier circuit. By properly choosing the resistance values of resistors 91 and 92 and the voltage rating of battery 90, maximum signal output from the push-pull output transistors may be obtained when the base current of each of these transistors is at a maximum. Thus, current flows from ground through emitter 84, collector 82, resistor 92 to the negative terminal of battery 90 and from ground through emitter 74, collector 72, resistor 91 to the negative terminal of battery 90.

If a positive half cycle of signal voltage is applied to transistor 70, the forward bias between the base 76 and emitter 74 of that transistor will decrease, thus decreasing its collector current. This decrease of collector current will increase the forward bias of the push-pull output transistor 30 and it will be conductive for a half cycle of signal. A half cycle amplified version of this signal will flow through one half of the primary winding 50 of output transformer 48.

At the same time, a negative half cycle of signal will be applied to the other input transistor 80 making its base 86 more negative, thus increasing the forward bias between the base 86 and emitter 84 of this transistor. If the biasing voltages are properly chosen, the impedance of the semi-conductive body 81 between the collector 82 and emitter 84 will decrease upon the application of a positive signal, providing a low impedance path to ground for the signals. Accordingly, the collector current of transistor 80 will reach saturation. It is in this manner that the base 46 of output transistor 40 will be clamped at substantially ground potential and it will be non-conductive during the negative half cycle of applied signal.

During the next half cycle of signal, the negative portion of the signal will be applied to transistor 70 saturating it and clamping the base 36 of output transistor 30 to substantially ground potential. The positive half cycle, on the other hand, will be applied to transistor 80, increasing the forward bias of output transistor 40 and causing current flow for a half cycle through the lower half of the primary winding 50 of output transformer 48. The signals through each half of the primary winding are combined to provide an amplified version of the original signal. The output signal is then coupled through the secondary winding 52 of output transformer 48 to the loudspeaker 54. Thus, class B push-pull amplification is obtained without the use of an input transformer.

As described herein, improved class B push-pull amplifier circuits utilizing transistors include means wherein the driving source is resistance coupled to the push-pull output stage. Thus, transformer coupling is not necessary and the resultant circuits are not only simple and reliable but relatively inexpensive as well.

What is claimed is:

1. In a signal amplifier circuit, the combination comprising a first and second transistor each including an emitter, a collector and a base electrode, means for biasing said first and second transistors, a signal output circuit connected for deriving a push-pull output signal between the collector and emitter electrodes of said first and second transistors, driving means providing a transformerless double-ended source of balanced input signals including a first and a second input terminal, a first capacitor connecting said first terminal with the base electrode of said first transistor, a second capacitor connecting said second terminal with the base electrode of said second transistor, said driving means being operative to simultaneously apply input signals through said first and second capacitors to said base electrodes of substantially equal amplitude and of an opposite polarity, a first semi-conductor device connected from the junction of said first capacitor and the base of said first transistor to a point of reference potential, and a second semi-conductor device connected from the junction of said second capacitor and the base electrode of said second transistor to said point of reference potential, said first and second semi-conductor devices having operating characteristics to provide a relatively high impedance to an alternating current signal of one polarity and a relatively low impedance to an alternating current signal of the opposite polarity to clamp the respective base electrodes of said transistors to said point of reference potential and to dissipate the charge on said first and second capacitors upon application of signals of said opposite polarity, whereby efficient class B push-pull operation of said first and second transistors is provided in response to the application of said input signals.

2. An amplifier circuit comprising, in combination, a first and second transistor each including an emitter, a collector and a base electrode, energizing means including a source of potential connected with said collector electrodes for applying biasing potentials thereto, a signal output circuit connected between said collector electrodes for deriving a push-pull output signal therefrom, driving means providing a transformerless double-ended source of balanced input signals including a first and a second input terminal, a first capacitor connecting said first terminal with the base electrode of said first transistor, a second capacitor connecting said second terminal with the base electrode of said second transistor, said driving means being operative to simultaneously apply input signals through said first and second capacitors to said base electrodes of substantially equal amplitude and of an opposite polarity, a first unilateral conducting device connected from the junction of said first capacitor and the base of said first transistor to a point of reference potential, a second unilateral conducting device connected from the junction of said second capacitor and the base of said second transistor to said point of reference potential, said first and second unilateral conducting devices being connected and poled to alternately provide a relatively low impedance signal conductive path to applied signals of the same polarity to clamp the respective base electrodes of said first and second transistors to said point of reference potential and to dissipate the charge on said first and second capacitors during the application of said applied signals thereby to provide efficient class B push-pull operation of said first and second transistors.

3. A class B push-pull amplifier circuit comprising, in combination, a first and second semi-conductor device each having a semi-conductive body and an emitter, collector and a base electrode, a signal output circuit connected between said collector electrodes, a third and fourth semi-conductor device each having a semi-conductive body and an emitter, a base and a collector electrode, means for applying operating potentials to the collector electrodes of said first, second, third and fourth devices, driving means providing a transformerless double-ended source of balanced input signals including a first and a second input terminal, a first capacitor connecting said first terminal with the base electrode of said third semi-conductor device, a second capacitor connecting said second terminal with the base electrode of said fourth semi-conductor device, said driving means being operative to apply input signals through said first and second capacitors of substantially equal amplitude and of an opposite polarity to the base electrodes of said third and fourth semi-conductor devices, means connecting the emitter electrodes of said third and fourth semi-conductor devices to a point of reference potential in said circuit, and means direct-current conductively connecting the collector electrodes of said third and fourth devices with the base electrodes of said first and second devices respectively, said third and fourth devices being biased and having characteristics wherein each provides a relatively high impedance to an alternating current signal of one polarity and a relatively low impedance to an alternating current signal of the opposite polarity to clamp the respective base electrodes of said first and second devices to said point of reference potential and to dissipate the charge on said first and second capacitors during signals of said opposite polarity thereby to provide efficient class B push-pull operation of said first and second semi-conductor devices.

4. An amplifier circuit comprising, in combination, a first and second transistor each including an emitter, a collector and a base electrode, energizing means including a source of potential for applying biasing potentials to said electrodes, a signal output circuit connected between said collector electrodes, means connecting said emitter electrodes with a point of reference potential in said circuit, driving means providing a transformerless double-ended source of balanced input signals including a first and a second input terminal, a first capacitor connecting said first terminal with the base electrode of said first transistor, a second capacitor connecting said second terminal with the base electrode of said second transistor, said driving means being operative to simultaneously apply input signals through said first and second capacitors to said base electrodes of substantially equal amplitude and of an opposite polarity, a first diode connected from the junction of said first capacitor and the base electrode of said first transistor to said point of reference potential, and a second diode connected from the junction of said second capacitor and the base electrode of said second transistor to said point of reference potential, said first and second diodes each providing a relatively low impedance signal path to an applied signal of one polarity to alternately clamp the base electrodes of said first and second transistors to said point of reference potential and to dissipate the charge on said first and second capacitors and providing a relatively high impedance to an applied signal of the opposite polarity, whereby said first and second transistors provide efficient class B push-pull operation.

References Cited in the file of this patent

UNITED STATES PATENTS

| | | |
|---|---|---|
| 1,985,352 | Numans | Dec. 25, 1934 |
| 2,338,410 | Cousins | Jan. 4, 1944 |
| 2,339,466 | Duft | Jan. 18, 1944 |
| 2,652,460 | Wallace | Sept. 15, 1953 |
| 2,666,819 | Raisbeck | Jan. 19, 1954 |
| 2,680,160 | Yaeger | June 1, 1954 |

OTHER REFERENCES

Barton: Abstract of publication Serial Number 68,248, pub. Aug. 5, 1952, 661. O.G. 307.

Bell Text, "The Transistor," published by Bell Telephone Co., December 1951 (page 373, F 16).